US012604523B2

(12) United States Patent
Lin et al.

(10) Patent No.: US 12,604,523 B2
(45) Date of Patent: Apr. 14, 2026

(54) ELECTRONIC DEVICE INCLUDING DETECTION ELEMENT AND INSULATION LAYER RECESS STRUCTURE

(71) Applicant: InnoCare Optoelectronics Corporation, Tainan City (TW)

(72) Inventors: Hsin-Hung Lin, Tainan City (TW); Chih-Hao Wu, Tainan City (TW)

(73) Assignee: InnoCare Optoelectronics Corporation, Tainan City (TW)

( * ) Notice: Subject to any disclaimer, the term of this patent is extended or adjusted under 35 U.S.C. 154(b) by 0 days.

(21) Appl. No.: 18/644,109

(22) Filed: Apr. 24, 2024

(65) Prior Publication Data

US 2024/0274486 A1     Aug. 15, 2024

Related U.S. Application Data

(63) Continuation of application No. 17/074,538, filed on Oct. 19, 2020, now abandoned.

(30) Foreign Application Priority Data

Oct. 25, 2019    (CN) .......................... 201911024201.4

(51) Int. Cl.
| | |
|---|---|
| *H01L 27/146* | (2006.01) |
| *H01L 21/56* | (2006.01) |
| *H01L 23/31* | (2006.01) |
| *H01L 27/12* | (2006.01) |
| *H10D 86/40* | (2025.01) |

(52) U.S. Cl.
CPC ........... *H10D 86/451* (2025.01); *H01L 21/56* (2013.01); *H01L 23/3178* (2013.01)

(58) Field of Classification Search
CPC .... H10D 86/451; H10D 86/60; H10D 86/411; H01L 21/56; H01L 23/3178; H10F 39/1898; H10F 39/026; H10F 39/189; H10F 39/802; H10F 30/223; H10F 30/29; H10F 30/295; H10F 39/8057; H10F 71/00; H10F 71/128; H10F 10/00; H10F 19/30; H10F 19/40; H10F 30/00; H10F 39/00
See application file for complete search history.

(56) References Cited

U.S. PATENT DOCUMENTS

| | | | |
|---|---|---|---|
| 9,147,719 B2 * | 9/2015 | Kim ........................ | H10D 86/60 |
| 9,564,478 B2 * | 2/2017 | Chang .................. | G09G 3/3677 |
| 2010/0019996 A1 * | 1/2010 | You .................... | H10D 86/0231 |
| | | | 345/76 |

(Continued)

*Primary Examiner* — Ajay Ojha
*Assistant Examiner* — Tsz K Chiu
(74) *Attorney, Agent, or Firm* — JCIPRNET

(57) ABSTRACT

An electronic device is provided. The electronic device includes a substrate, an active element, a first insulation layer, and a detection element. An active element is disposed on the substrate. A first insulation layer is disposed on the active element. A detection element is disposed on the first insulation layer. The detection element comprises a lower electrode disposed on the first insulation layer, an active layer disposed on the lower electrode, an upper electrode disposed on the active layer, and the lower electrode is a part of a conductive layer. The first insulation layer has a recess, and the recess does not overlap with the conductive layer in a normal direction of the substrate.

11 Claims, 9 Drawing Sheets

(56)  References Cited

U.S. PATENT DOCUMENTS

| 2010/0134735 A1* | 6/2010 | Nakamura | .......... | H10F 30/2235 |
| | | | | 257/53 |
| 2010/0182223 A1* | 7/2010 | Choi | .................... | H10D 86/423 |
| | | | | 345/76 |
| 2011/0127593 A1* | 6/2011 | Hayashi | .............. | H10F 39/1898 |
| | | | | 257/292 |
| 2014/0103347 A1* | 4/2014 | Ishino | ................. | H10F 39/1898 |
| | | | | 438/59 |
| 2014/0151684 A1* | 6/2014 | Wu | ...................... | H10D 86/423 |
| | | | | 257/43 |

* cited by examiner

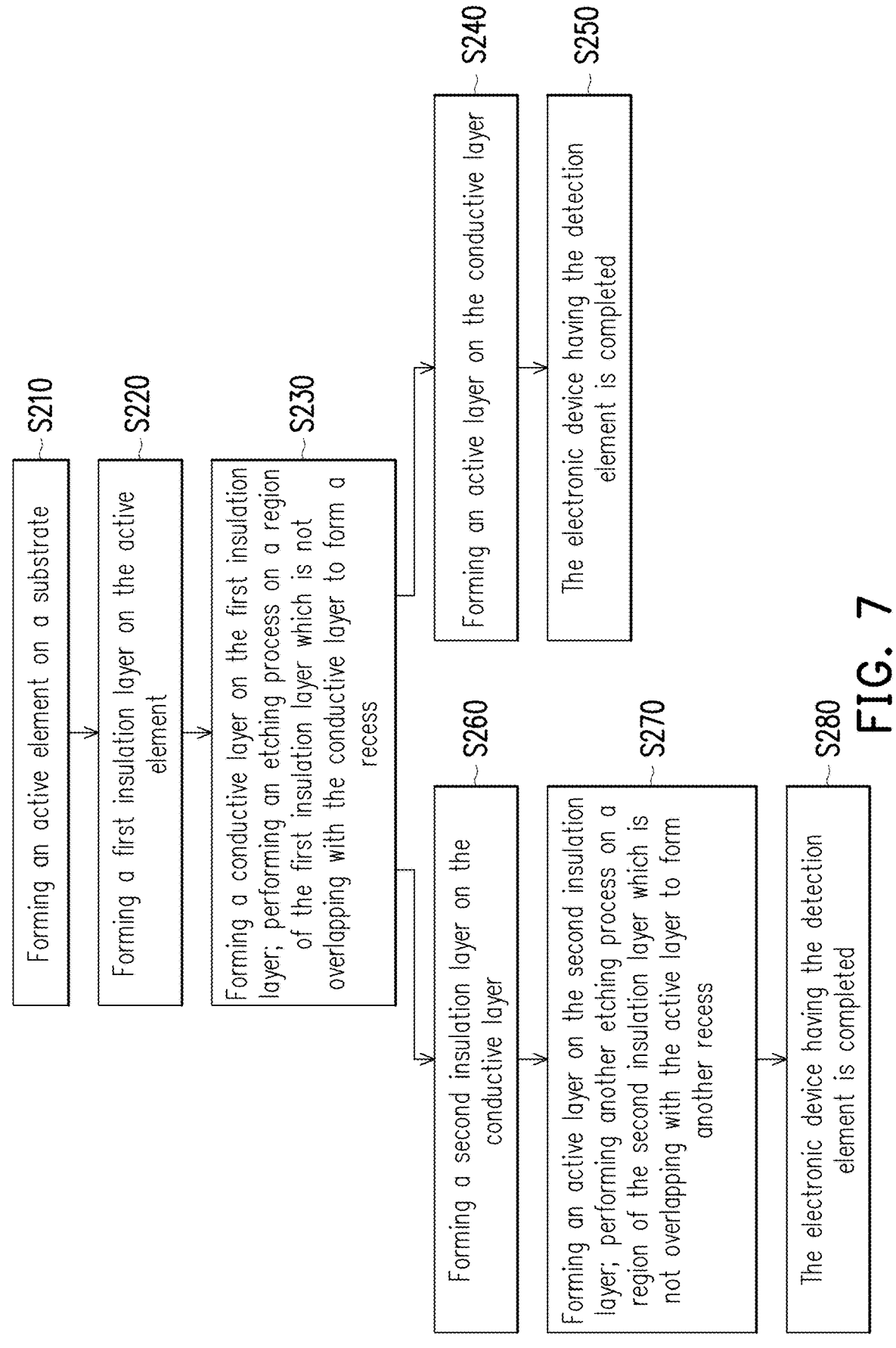

S210

Forming an active element on a substrate

S220

Forming a first insulation layer on the active element

S230

Forming a conductive layer on the first insulation layer; performing an etching process on a region of the first insulation layer which is not overlapping with the conductive layer to form a recess

S240

Forming an active layer on the conductive layer

S250

The electronic device having the detection element is completed

S260

Forming a second insulation layer on the conductive layer

S270

Forming an active layer on the second insulation layer; performing another etching process on a region of the second insulation layer which is not overlapping with the active layer to form another recess

S280

The electronic device having the detection element is completed

FIG. 7

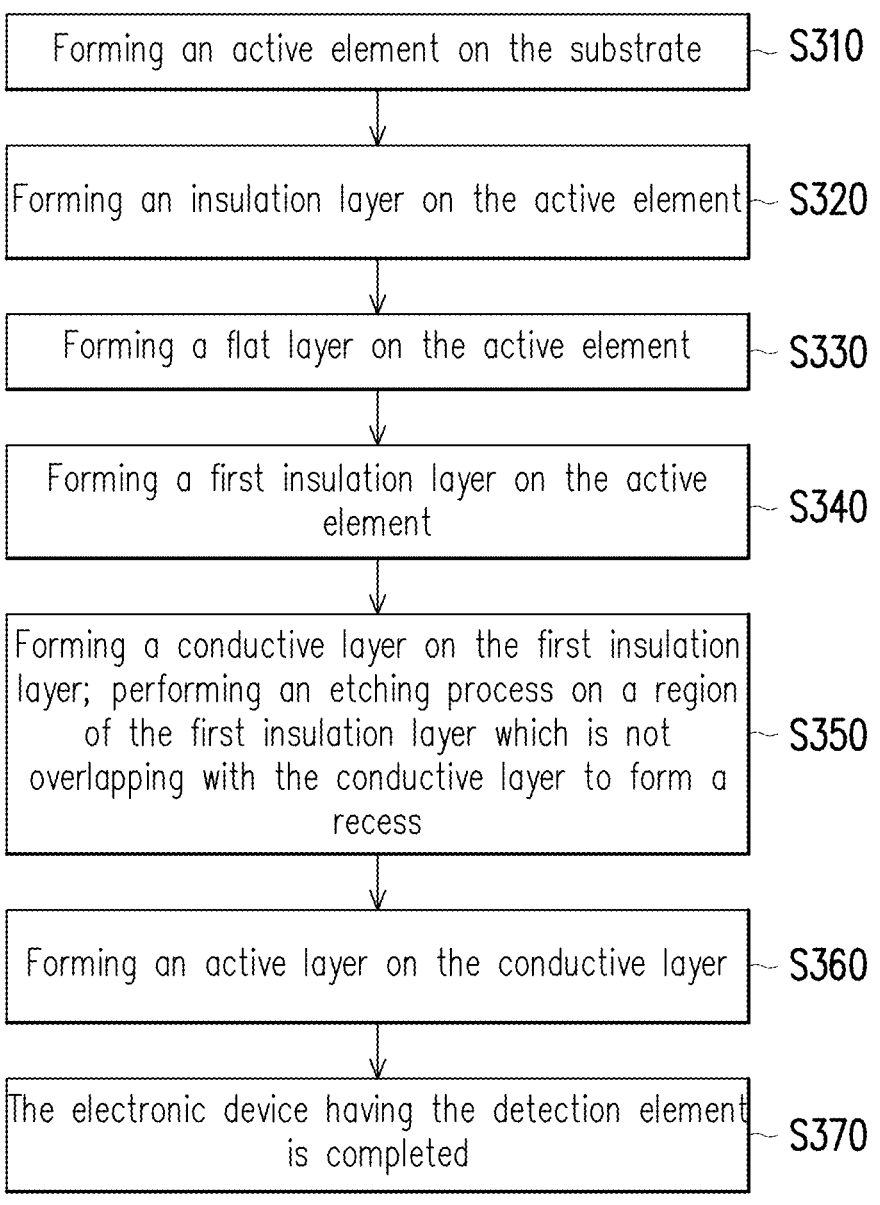

Forming an active element on the substrate — S310

Forming an insulation layer on the active element — S320

Forming a flat layer on the active element — S330

Forming a first insulation layer on the active element — S340

Forming a conductive layer on the first insulation layer; performing an etching process on a region of the first insulation layer which is not overlapping with the conductive layer to form a recess — S350

Forming an active layer on the conductive layer — S360

The electronic device having the detection element is completed — S370

FIG. 8

Forming a conductive layer on the first insulation layer — S410

Forming an active layer on the conductive layer — S420

Performing an etching process on a region of the first insulation layer which is not overlapping with the conductive layer to form a recess — S430

The electronic device having the detection element is completed — S440

ELECTRONIC DEVICE INCLUDING DETECTION ELEMENT AND INSULATION LAYER RECESS STRUCTURE

CROSS-REFERENCE TO RELATED APPLICATION

This application is a continuation application of and claims the priority benefit of U.S. application Ser. No. 17/074,538, filed on Oct. 19, 2020, which claims the priority benefit of China application serial no. 201911024201.4, filed on Oct. 25, 2019. The entirety of each of the above-mentioned patent applications is hereby incorporated by reference herein and made a part of this specification.

BACKGROUND

Technical Field

The disclosure relates to an electronic device, and in particular to an electronic device having a detection element.

Description of Related Art

With the vigorous development of electronic products, some electronic devices may have detection elements for sensing. However, during the manufacturing process of the electronic device, the performance of the elements in the electronic device may be changed due to the influence of water or gas. Therefore, how to reduce the above issue is a topic to be discussed nowadays.

SUMMARY

The disclosure provides the electronic device, includes a substrate, an active element, a first insulation layer, and a detection element. An active element is disposed on the substrate. A first insulation layer is disposed on the active element. A detection element is disposed on the first insulation layer. The detection element comprises a lower electrode disposed on the first insulation layer, an active layer disposed on the lower electrode, an upper electrode disposed on the active layer, and the lower electrode is a part of a conductive layer. The first insulation layer has a recess, and the recess does not overlap with the conductive layer in a normal direction of the substrate. In the normal direction of the substrate, a first portion of the first insulation layer overlaps with the conductive layer and has a first thickness, a second portion of the first insulation layer does not overlap with the conductive layer and has a second thickness, and the second thickness is less than the first thickness.

The disclosure provides an method of manufacturing an electronic device, including forming an active element on a substrate; forming a first insulation layer on the active element; forming a conductive layer on the first insulation layer; performing an etching process on a region of the first insulation layer which is not overlapping with the conductive layer to form a recess; and forming a active layer on the conductive layer.

Based on the above, the insulation layer of the electronic device according to the embodiments of the disclosure is disposed on the active element, which can reduce the influence of liquid and/or gas (such as including hydrogen ions, oxygen ions, other ions or other elements) on the active element during the manufacturing process. In addition, by removing a portion of the insulation layer adjacent to or corresponding to the active element to form the recess, the chance that the gas in the insulation layer diffuses to the active element and causes the characteristics of the active element to become offset or invalid is reduced. With such design, the electronic device according to the embodiments of the disclosure can have better reliability.

BRIEF DESCRIPTION OF THE DRAWINGS

The drawings are included for further understanding of the disclosure, and the drawings are incorporated into the specification and constitute a part of the specification. The drawings illustrate the embodiments of the disclosure, and serve to explain the principles of the disclosure together with the descriptions.

FIG. 7 is a flowchart of a manufacturing method of an electronic device according to an embodiment of the disclosure.

FIG. 8 is a flowchart of a manufacturing method of an electronic device according to another embodiment of the disclosure.

DETAILED DESCRIPTION OF DISCLOSED EMBODIMENTS

Figure 1:
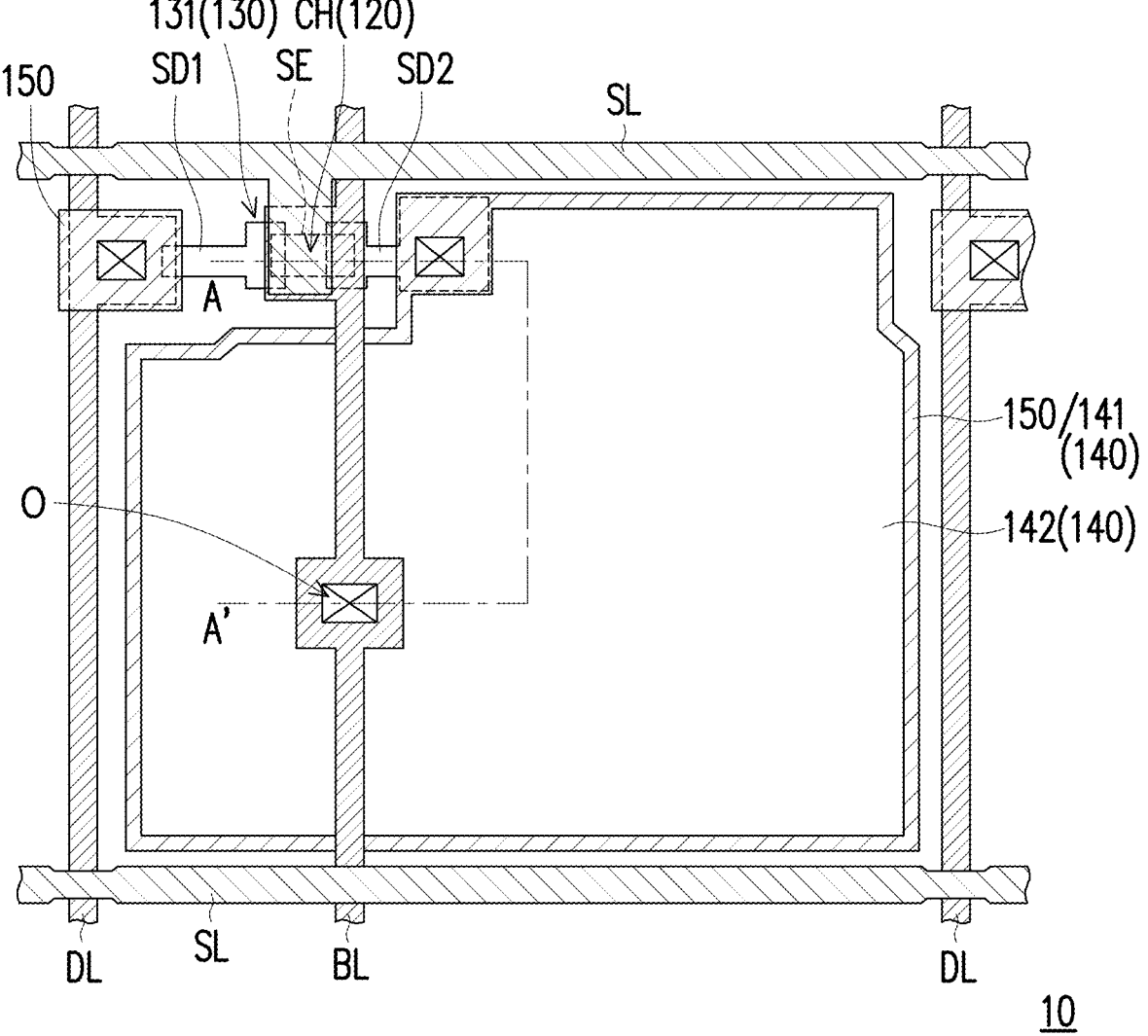
FIG. 1 is a schematic top view of an electronic device according to an embodiment of the disclosure.

When a structure (layer, component, or substrate) is described in the disclosure as being located on another structure (layer, component, or substrate), the two structures may be adjacent and directly connected, or the two structures may be adjacent but not directly connected. Indirect connection refers to that there is at least one intermediary structure (intermediary layer, intermediary component, intermediary substrate, or intermediary spacing) between the two structures, the lower surface of one structure is adjacent to or directly connected to the upper surface of the intermediary structure, and the upper surface of the other structure is adjacent to or directly connected to the lower surface of the intermediary structure. The intermediary structure may be a physical structure or non-physical structure composed of a single layer or multiple layers, but not limited thereto. In the disclosure, when a structure is disposed "on" another structure, the structure may be "directly" on the other structure, or the structure may be "indirectly" on the other structure, that is, there is at least one structure sandwiched between the structure and the other structure.

The electrical connection or coupling described in the disclosure may refer to direct connection or indirect connection. In the case of direct connection, the endpoints of two elements of a circuit are directly connected or connected to each other by a conductor segment. In the case of indirect connection, there is a switch, diode, capacitor, inductor, resistor, other suitable component or a combination of the above components between the endpoints of the two elements of the circuit, but not limited thereto.

In the disclosure, the length and the width of a component may be measured from an image obtained by an optical microscope, the thickness of a component may be measured from a cross-sectional image obtained by an electronic microscope, but not limited thereto. In addition, any two values or directions for comparison may have certain errors. If a first value is equal to a second value, it implies that there may be an error of about 10% between the first value and the second value; if a first direction is perpendicular to a second direction, then the angle between the first direction and the second direction may be between 80 degrees and 100 degrees; and if a first direction is parallel to a second direction, then the angle between the first direction and the second direction may be between 0 degrees and 10 degrees.

An electronic device of the disclosure may include a display device, an antenna device, a sensing device, a light emitting device, a splicing device, other suitable device, or a combination of the above devices, but not limited thereto. The sensing device includes an optical sensing device, a touch sensing device, other suitable sensing device or a combination thereof, but not limited thereto. The optical sensing device includes an ultraviolet or infrared sensing device, a sensing device of other suitable light or a combination of thereof, but not limited thereto. The antenna device may be, for example, a liquid crystal antenna, but not limited thereto. The electronic device may include a foldable electronic device or a flexible electronic device. The electronic device may include liquid crystal, light emitting diode, fluorescence, phosphor, other suitable material or a combination thereof, but not limited thereto. The light emitting diode may include, for example, organic light emitting diode (OLED), micro light emitting diode (including mini LED and/or micro LED), quantum dot (QD) LED, other suitable material, or a combination thereof, but not limited to thereto.

In the disclosure, the various embodiments described below may be mixed and matched without departing from the spirit and scope of the disclosure. For example, some features of one embodiment may be combined with some features of another embodiment to become another embodiment. References will now be made in detail to the exemplary embodiments of the disclosure, and the examples of the exemplary embodiments are illustrated in the drawings. Wherever possible, the same reference numerals are used in the drawings and descriptions to denote the same or similar parts.

Figure 2:
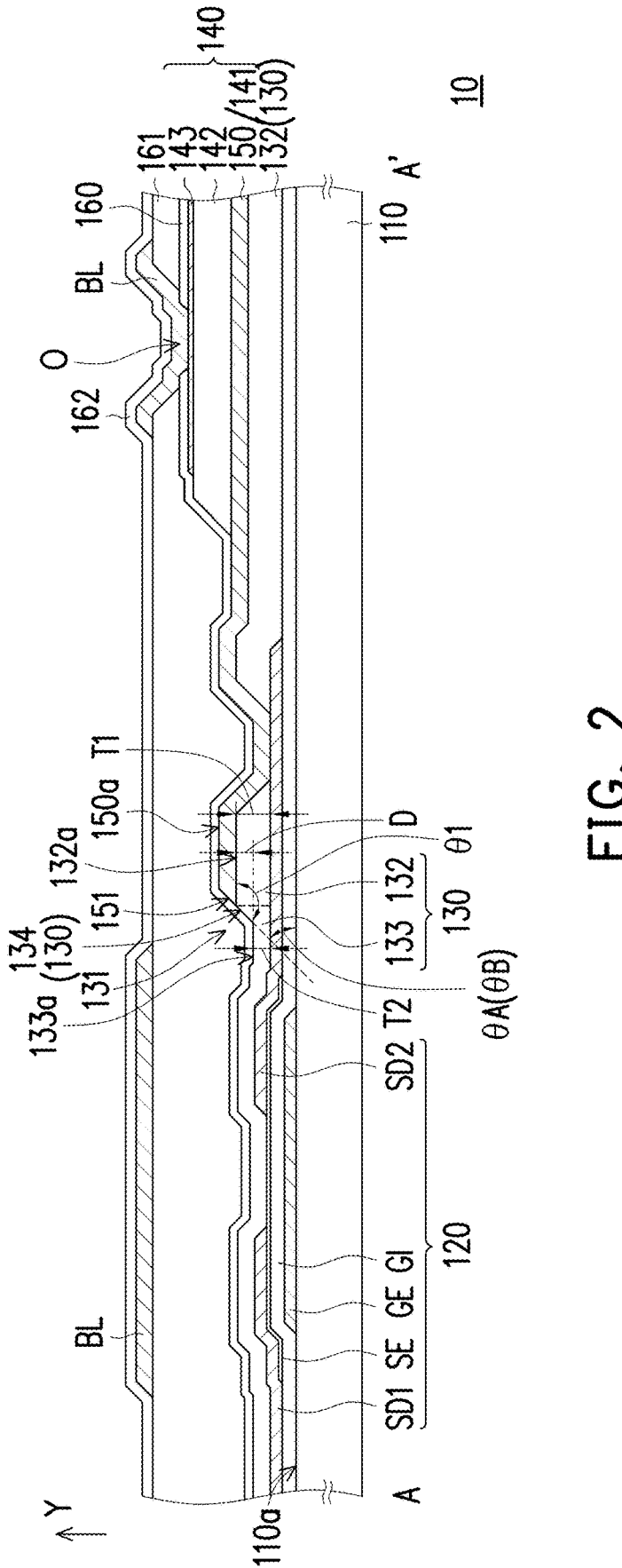
FIG. 2 is a schematic cross-sectional view of the electronic device of FIG. 1 along a cross-sectional line AA'.

FIG. 1 is a schematic top view of an electronic device according to an embodiment of the disclosure. For the sake of clarity of the drawing and convenience of description, FIG. 1 omits the illustration of several elements. FIG. 2 is a schematic cross-sectional view of the electronic device of FIG. 1 along a cross-sectional line AA'. Please refer to FIG. 1 and FIG. 2. An electronic device 10 includes a substrate 110, an active element 120, a first insulation layer 130, and a detection element 140. The active element 120 may be disposed on the substrate 110. In some embodiments, as shown in FIG. 1 and FIG. 2, the first insulation layer 130 is disposed on the active element 120, and the detection element 140 is disposed on the first insulation layer 130. In some embodiments, the substrate 110 may include a transparent substrate or a non-transparent substrate. In some embodiments, the substrate 110 may include a hard substrate or a flexible substrate. For example, the material of the substrate 110 may include glass, quartz, sapphire, ceramic, polycarbonate (PC), polyimide (PI), polyethylene terephthalate (PET), other suitable substrate material or a combination thereof, but not limited thereto. In some embodiments, a scan line SL, a read line DL, and/or a bias signal line BL may be provided on the substrate 110, but not limited thereto.

Please refer to FIG. 1 and FIG. 2. In some embodiments, the scan line SL may intersect with the read line DL. In some embodiments, the scan line SL may, for example, intersect with the bias signal line BL, but not limited thereto. In some embodiments, the active element 120 is disposed on the substrate 110 and is electrically connected to the scan line SL and the read line DL, respectively. The active element 120 is electrically connected to the detection element 140. The active element 120 is a transistor. In some embodiments, the active element 120 includes amorphous silicon thin film transistor, polysilicon thin film transistor (such as low temperature polysilicon thin film transistor, LTPS TFT), indium gallium zinc oxide (IGZO) thin film transistor, other suitable transistor, or a combination thereof, but not limited thereto.

Please refer to FIG. 1 and FIG. 2, in some embodiments, the detection element comprises a lower electrode 141, an active layer 142 and an upper electrode 143, the lower electrode 141 is a part of a conductive layer 150. The active layer 142 is located between the lower electrode 141 and the upper electrode 143. The conductive layer 150 may be disposed on the substrate 110, and the conductive layer 150 may be disposed on the first insulation layer 130. In some embodiments, the first insulation layer 130 is disposed between the conductive layer 150 and the active element 120, and the first insulation layer 130 covers the active element 120. The structure of the detection element 140 will be described in detail later. In some embodiments, the first insulation layer 130 has a recess 131. The recess 131 does not overlap with the conductive layer 150 in a normal direction Y of the substrate 110. Please refer to FIG. 1 and FIG. 2. In some embodiments, the first insulation layer 130 includes a first portion 132 and a second portion 133. In the normal direction Y of the substrate 110, the first portion 132 of the first insulation layer 130 overlaps with the conductive layer 150 and has a first thickness T1, and the second portion 133 of the first insulation layer 130 does not overlap with the conductive layer 150 and has a second thickness T2. In some embodiments, the second thickness T2 is less than the first thickness T1. In some embodiments, the first portion 132 is connected to the second portion 133. It should be noted that under a cross-section, the first thickness T1 may be the maximum thickness of the first portion 132 of the first insulation layer 130 in the normal direction Y of the substrate 110, and the second thickness T2 may be the minimum thickness of the second portion 133 of the first insulation layer 130 in the normal direction Y of the substrate 110. The first thickness T1 and/or the second thickness T2 may be obtained by measuring a scanning electron microscope (SEM) image obtained from a local area. For example, the SEM image may show the edge of the conductive layer 150, at least a portion of the first portion 132 of the first insulation layer 130, and at least a portion of the second portion 133 of the first insulation layer 130, but not limited thereto.

Please refer to FIG. 1 and FIG. 2. In some embodiments, the thickness of the first insulation layer 130 may be greater than or equal to 0.15 μm and less than or equal to 0.25 μm (0.15 μm≤thickness≤0.25 μm), but not limited thereto. In some embodiments, the thickness of the first insulation layer 130 may be greater than or equal to 0.18 μm less than or equal to 0.23 μm (0.18 μm≤thickness≤0.23 μm). In some embodiments, the recess 131 of the first insulation layer 130 has a depth D, the first insulation layer 130 has a first thickness T1, and the depth D is greater than or equal to 0.01 μm and less than or equal to the first thickness T1 (0.01 μm<depth D<first thickness T1), but not limited thereto. It should be noted that the depth D is defined by the maximum distance between a top surface 132a of the first portion 132 and a top surface 133a of the second portion 133 in the normal direction Y of the substrate 110. In other words, the depth D is defined by the maximum depth of the recess 131 of the first insulation layer 130 in the normal direction Y of the substrate 110. In some embodiments, the recess 131 of the first insulation layer 130 is formed by an etching process or other process, but not limited thereto. In some embodiments, the material of the first insulation layer 130 includes silicon oxide, silicon nitride, silicon oxynitride or a combination thereof, but not limited thereto.

Please refer to FIG. 1 and FIG. 2, in some embodiments, the first insulation layer 130 has the recess 131. At least a portion of a first side wall surface 134 of the recess 131 is aligned with at least a portion of a second side wall surface 151 of the conductive layer 150, but not limited thereto. In detail, as shown in FIG. 2, the first side wall surface 134 is connected between the top surface 132a of the first portion 132 of the first insulation layer 130 and the top surface 133a of the second portion 133 of the first insulation layer 130. In some embodiments, the angle θ1 between the first side wall surface 134 of the recess 131 and the top surface 132a of the first portion 132 is greater than 90 degrees, but not limited thereto. In some embodiments, the junction between the first side wall surface 134 and the top surface 132a of the first portion 132 (or the top surface 133a of the second portion 133) may include an arced surface, but not limited thereto. In some embodiments, the conductive layer 150 has a second side wall surface 151. The second side wall surface 151 of the conductive layer 150 is connected to a top surface 150a of the conductive layer 150. In some embodiments, the angle between the second side wall surface 151 of the conductive layer 150 and the top surface 150a of the conductive layer 150 is greater than 90 degrees, but not limited thereto. In some embodiments, the junction between the second side wall surface 151 and the top surface 150a of the conductive layer 150 may include a curved surface, but not limited thereto. In some embodiments, the included angle θA between the extension surface of the first side wall surface 134 and a top surface 110a of the substrate 110 may be substantially equal to the included angle θB between the extension surface of the second side wall surface 151 and the top surface 110a of the substrate 110, but not limited thereto. In some embodiments (not shown), the included angle θA between the extension surface of the first side wall surface 134 and the top surface 110a of the substrate 110 may be different from the included angle θB between the extension surface of the second side wall surface 151 and the top surface 110a of the substrate 110. In some embodiments, the first side wall surface 134 of the first insulation layer 130 and/or the second side wall surface 151 of the conductive layer 150 may include flat surfaces, curved surfaces or other irregular surfaces, but not limited thereto.

Please refer to FIG. 1 and FIG. 2, In some embodiments, the material of the conductive layer 150 may include a transparent conductive material, a non-transparent conductive material (such as metal material), or a combination thereof. The material of the conductive layer 150 may include indium tin oxide, indium zinc oxide, indium oxide, zinc oxide, tin oxide, organic conductive material, aluminum, molybdenum, copper, silver or a combination thereof, but not limited thereto. In some embodiments, the material of the upper electrode 143 may include a transparent conductive material, such as indium tin oxide, indium zinc oxide, indium oxide, zinc oxide, tin oxide or a combination thereof, but not limited thereto. In some embodiments, the material of the active layer 142 may include a P-type and/or N-type semiconductor material, such as a positive-intrinsic-negative (PIN) multi-layer structure, but not limited thereto.

Please refer to FIG. 1 and FIG. 2. In some embodiments, the electronic device 10 further includes an insulation layer 160, a flat layer 161 and/or a protective layer 162. The insulation layer 160 is disposed on the detection element 140 and is configured to cover the detection element 140 and/or the active element 120, but not limited thereto. In some embodiments, the flat layer 161 is disposed on the insulation layer 160, and the material of the flat layer 161 may include organic material or other suitable material, but not limited thereto. In some embodiments, the bias signal line BL is disposed on the flat layer 161, the bias signal line BL is electrically connected to the upper electrode 143 of the detection element 140 via an opening O. The opening O is an opening formed by penetrating the flat layer 161 (and/or the insulation layer 160), but not limited thereto. In some embodiments, as shown in FIG. 1 and FIG. 2, the protective layer 162 is disposed on the bias signal line BL and covers the bias signal line BL and/or the flat layer 161, but not limited thereto.

Please refer to FIG. 1 and FIG. 2. In some embodiments, the active element 120 includes a gate GE, a gate insulation layer GI, a semiconductor layer SE, a source SD1 and a drain SD2, but not limited thereto. In some embodiments, one of the source SD1 or the drain SD2 is connected to the lower electrode 141 of the detection element 140, and at least a portion of the source SD1 (or the drain SD2) overlaps with the semiconductor layer SE in the normal direction Y of the substrate 110. In some embodiments, the materials of the source SD1 and/or the drain SD2 may include transparent conductive materials or non-transparent conductive materials, such as indium tin oxide, indium zinc oxide, indium oxide, zinc oxide, tin oxide, metal materials (such as aluminum, molybdenum, copper, silver, etc.), other suitable materials, or combinations thereof, but not limited thereto. In some embodiments, the material of the semiconductor layer SE may include amorphous silicon, LTPS, metal oxide (such as IGZO), other suitable material or a combination thereof, but not limited thereto.

Please refer to FIGS. 1 and 2. In some embodiments, in the normal direction Y of the substrate 110, the recess 131 may selectively overlap with the active element 120. For example, in the normal direction Y of the substrate 110, the recess 131 of the first insulation layer 130 overlaps with a channel area CH of the active element 120. The recess 131 may substantially correspond to the second portion 133 of the first insulation layer 130. In other words, the second portion 133 of the first insulation layer 130 in the normal direction Y of the substrate 110 may overlap with the channel area CH of the active element 120, but not limited thereto. In some embodiments (refer to subsequent FIG. 3 and FIG. 4), in the normal direction Y of the substrate 110, the conductive layer 150 overlaps with (or covers) at least a portion of the channel area CH of the active element 120. The channel area CH is defined by an area of the semiconductor layer SE overlapping with the gate GE.

Please refer to FIG. 1 and FIG. 2. In some embodiments, the first insulation layer 130 may be configured as a protective layer of the semiconductor layer SE to reduce the influence of liquid and gas (such as including hydrogen ions, oxygen ions, or other ions or elements) on the active element 120 (such as the semiconductor layer SE of the active element 120) during the manufacturing process, which changes the characteristics of the active element 120, but not limited thereto. In some embodiments, during the manufacturing process of the first insulation layer 130 (or the detection element 140), the liquid or gas (such as including hydrogen ions, oxygen ions, or other ions or elements) may be induced to diffuse to the first insulation layer 130 in a high temperature environment, thereby causing the characteristics of the active element 120 change, or even causing the active element 120 to lose its switching characteristics. It should be noted that, the conductive layer 150 may reduce the diffusion of gas (such as including hydrogen ions, oxygen ions, or other ions or elements) to the layer (such as the first insulation layer 130) below the conductive layer 150. In other words, the content of gas (such as including hydrogen ions, oxygen ions, other ions or elements) in the first insulation layer 130 overlapping below the conductive layer 150 is less than the content of gas (such as including hydrogen ions, oxygen ions, or other ions or elements) in the first insulation layer 130 not overlapping below the conductive layer 150, but not limited thereto. In some embodiments, a portion of the first insulation layer 130 may be etched to reduce the thickness of the first insulation layer 130 (that is, the second portion 133) not overlapping with the conductive layer 15, so as to form the recess 131 of the first insulation layer 130. The first insulation layer 130 may have more gas (such as including hydrogen ions, oxygen ions, or other ions or elements), the issue of the characteristics of the active element changing due to the influence of the gas may be reduced by reducing the thickness of the second portion 133 in the first insulation layer 130 closer to the semiconductor layer SE.

Figure 3:
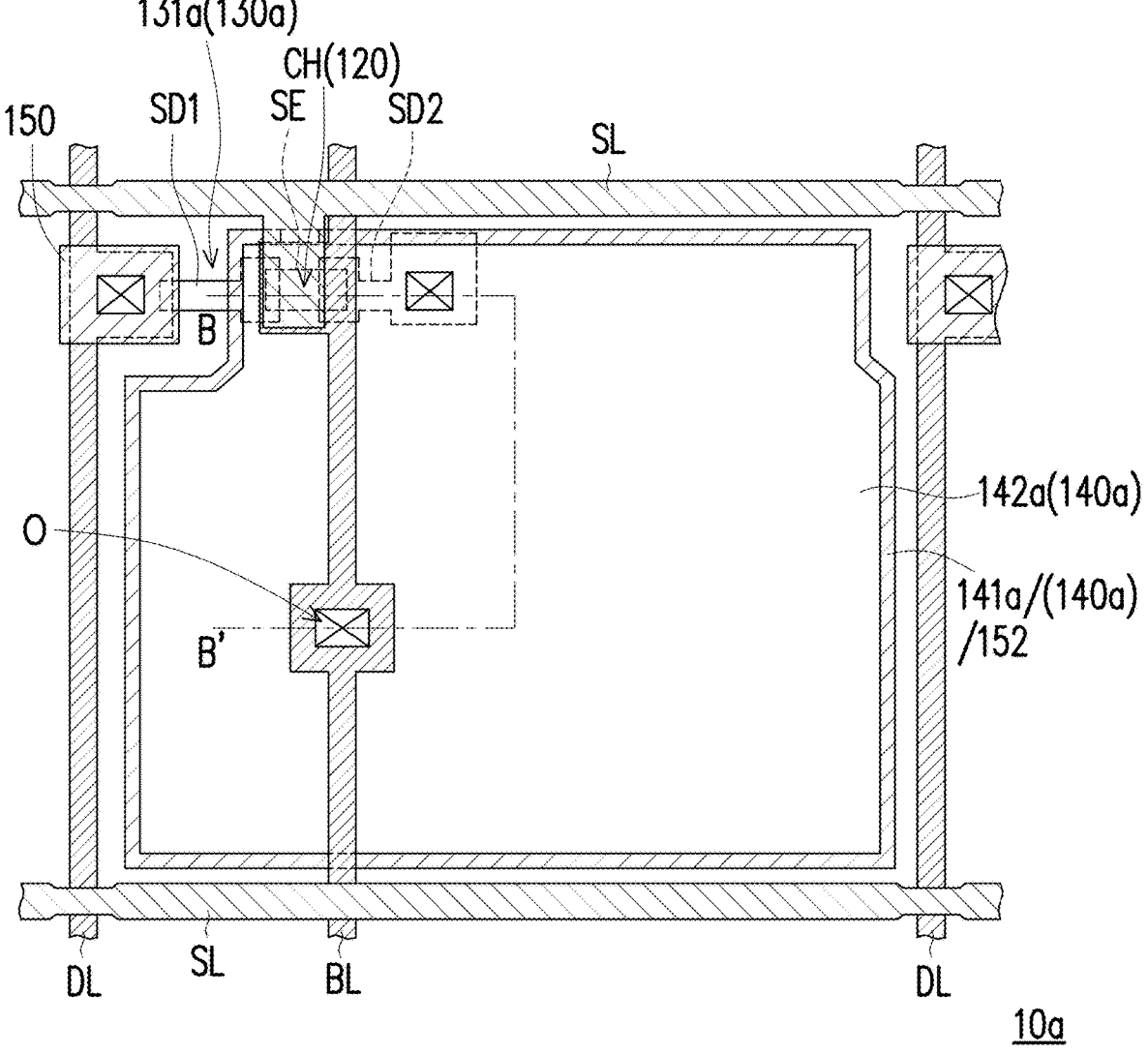
FIG. 3 is a schematic top view of an electronic device according to another embodiment of the disclosure.
Figure 4:
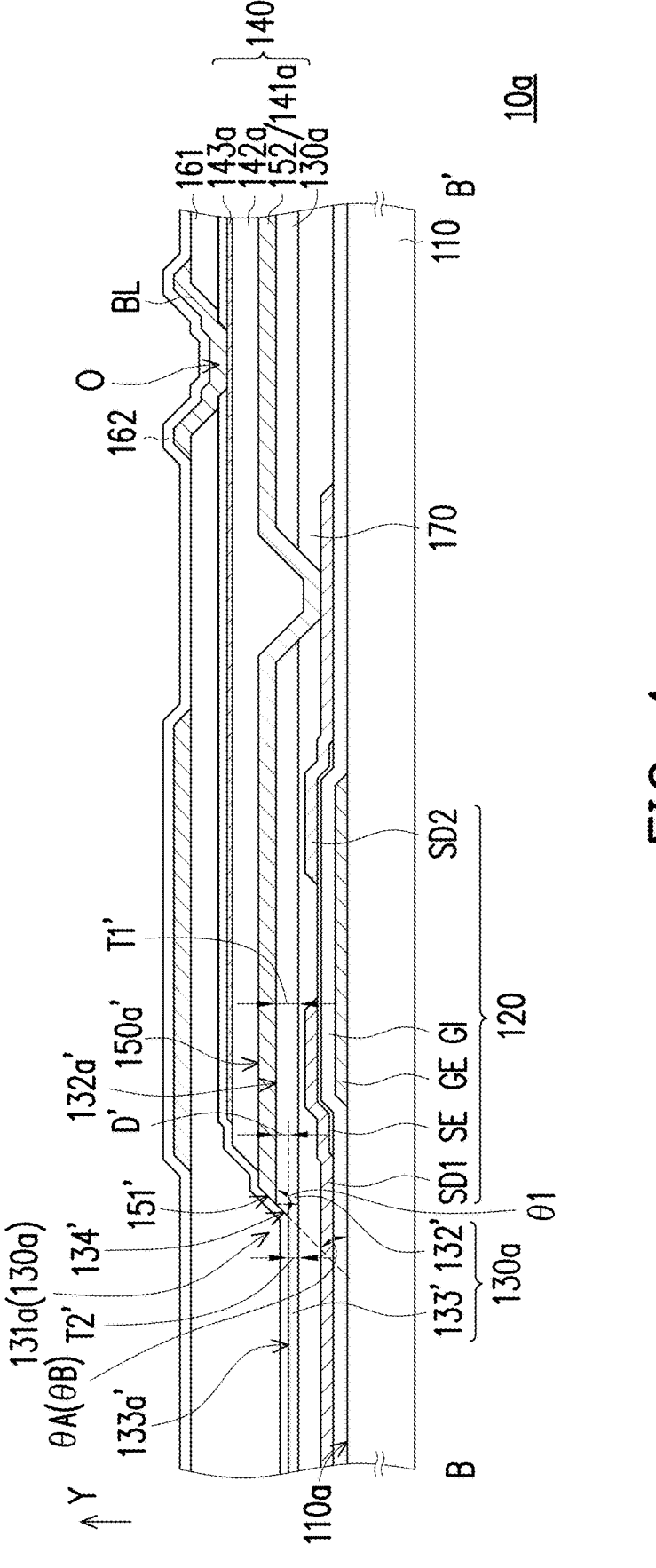
FIG. 4 is a schematic cross-sectional view of the electronic device of FIG. 3 along a cross-sectional line B-B'.

FIG. 3 is a schematic top view of an electronic device according to another embodiment of the disclosure. FIG. 4 is a schematic cross-sectional view of the electronic device of FIG. 3 along a cross-sectional line B-B'. An electronic device 10a of the embodiment is substantially similar to the electronic device 10 of FIG. 1 and FIG. 2, and the similar components in the two embodiments will not be repeated here. The electronic device 10a differs from the electronic device 10 in that the electronic device 10a further includes a flat layer 170. The flat layer 170 is disposed between the active element 120 and a first insulation layer 130a, but not limited thereto.

Please refer to FIG. 3 and FIG. 4. In some embodiments, before forming a detection element 140a, the flat layer 170 may be formed to flatten the surface of the structural layer, which may improve the flexibility of forming the detection element 140a. For example, a lower electrode 141a (such as a portion of a conductive layer 152) of the detection element 140a, an active layer 142a, and/or an upper electrode 143a may be formed or disposed on the flat layer 170 and/or may selectively overlap with the active element 120 to increase the detection area of the detection element 140a or the detection efficiency, but not limited thereto. In some embodiments, the material of the flat layer 170 may include an organic material, but not limited thereto. In some embodiments, the flat layer 170 may include a single-layer or multi-layer structure.

Please refer to FIG. 3 and FIG. 4. In some embodiments, similar to FIG. 1 and FIG. 2, the first insulation layer 130a may include a first portion 132' and a second portion 133'. In some embodiments, in the normal direction Y of the substrate 110, the first portion 132' overlaps with the conductive layer 152 and has a first thickness T1', and the second portion 133' does not overlap with the conductive layer 152 and has a second thickness T2'. The second thickness T2' is less than the first thickness T1'. In some embodiments, the first portion 132' is connected to the second portion 133'. It should be noted that under a cross-section, the first thickness T1' may be defined by the maximum thickness of the first portion 132' of the first insulation layer 130a in the normal direction Y of the substrate 110, and the second thickness T2' may be defined by the minimum thickness of the second portion 133' of the first insulation layer 130a in the normal direction Y of the substrate 110. The first thickness T1' and/or the second thickness T2' may be obtained by measuring an SEM image of a local area. For example, the SEM image may show the edge of the conductive layer 152, at least a portion of the first portion 132' of the first insulation layer 130a, and at least a portion of the second portion 133' of the first insulation layer 130a, but not limited thereto.

Please refer to FIG. 3 and FIG. 4. In some embodiments, the first insulation layer 130a has a recess 131a. In the normal direction Y of the substrate 110, the recess 131a does not overlap with the conductive layer 152. In some embodiments, in the normal direction Y of the substrate 110, the recess 131a may selectively overlap or not overlap with at least a portion of the channel area CH of the active element 120. In some embodiments, the recess 131a of the first insulation layer 130a has a depth D'. The depth D' is the maximum distance between a top surface 132a' of the first portion 132' and a top surface 133a' of the second portion 133' in the normal direction Y of the substrate 110. In other words, the depth D' is the maximum depth of the recess 131a of the first insulation layer 130a in the normal direction Y of the substrate 110. In some embodiments, the depth D' of the recess 131a is greater than or equal to 0.01 μm and less than or equal to the first thickness T1' (0.01 μm<depth D'<first thickness T1'), but not limited thereto. In some embodiments, the recess 131a of the first insulation layer 130a is formed by an etching process or other suitable manner, but not limited thereto.

Please refer to FIG. 3 and FIG. 4. In some embodiments, at least a portion of a first side wall surface 134' of the recess 131a is aligned with a portion of a second side wall surface 151' of the conductive layer 152, but not limited thereto. In detail, as shown in FIG. 4, the first side wall surface 134' is connected between the top surface 132a' of the first portion 132' of the first insulation layer 130a and the top surface 133a' of the second portion 133' of the first insulation layer 130a. In some embodiments, the junction between the first side wall surface 134' and the top surface 132a' of the first portion 132' (or the top surface 133a' of the second portion 133) may include an arced surface, but not limited thereto. In some embodiments, the conductive layer 152 has a second side wall surface 151'. The second side wall surface 151' is connected to a top surface 150a' of the conductive layer 152. In some embodiments, the included angle θA between the extension surface of the first side wall surface 134' and the top surface 110a of the substrate 110 may be substantially equal to the included angle θB between the extension surface of the second side wall surface 151' and the top surface 110a of the substrate 110, but not limited thereto. In some embodiments (not shown), the included angle θA between the extension surface of the first side wall surface 134' and the top surface 110a of the substrate 110 may be different from the included angle θB between the extension surface of the second side wall surface 151' and the top surface 110a of the substrate 110. In some embodiments, the first side wall surface 134' of the first insulation layer 130a and/or the second side wall surface 151' of the conductive layer 152 may include flat surfaces, curved surfaces or other irregular surfaces, but not limited thereto.

Figure 5:
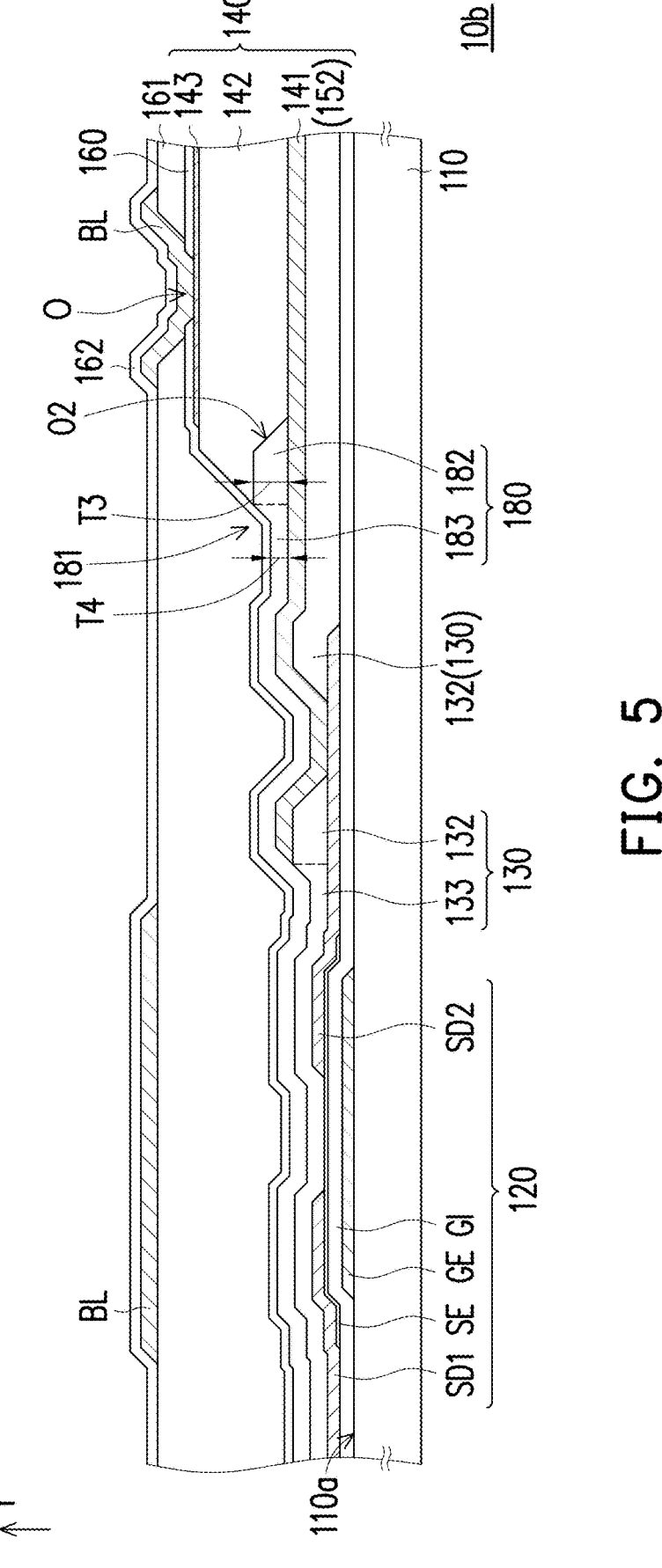
FIG. 5 is a schematic cross-sectional view of an electronic device according to another embodiment of the disclosure.

FIG. 5 is a schematic cross-sectional view of an electronic device according to another embodiment of the disclosure. An electronic device 10b of the embodiment is similar to the electronic device 10 of FIG. 2, so similar components in the two embodiments will not be repeated. The electronic device 10b of the embodiment differs from the electronic device 10 mainly in that the electronic device 10b of the embodiment further includes a second insulation layer 180.

Please refer to FIG. 5. In some embodiments, the second insulation layer 180 is disposed between the active layer 142 of the detection element 140 and the lower electrode 141. The second insulation layer 180 has another recess 181. In the normal direction Y of the substrate 110, another recess 181 does not overlap with the active layer 142, but not limited thereto. In some embodiments, the second insulation layer 180 has an opening O2, and the active layer 142 is electrically connected to the lower electrode 141 via the opening O2, but not limited thereto. In some embodiments, the material of the second insulation layer 180 includes an organic material or an inorganic material. In some embodiments, the material of the second insulation layer 180 includes silicon oxide, silicon nitride, silicon oxynitride or a combination thereof, but not limited thereto. In some embodiments, as shown in FIG. 5, in the normal direction Y of the substrate 110, another recess 181 may overlap with a portion of the lower electrode 141. In some embodiments, another recess 181 of the second insulation layer 180 is formed by another etching process or other suitable process.

Please refer to FIG. 5. In some embodiments, the second insulation layer 180 may include a third portion 182 and a fourth portion 183. In the normal direction Y of the substrate 110, the third portion 182 overlaps with the active layer 142 and has a third thickness T3, and the fourth portion 183 does not overlap with the active layer 142 and has a fourth thickness T4. In some embodiments, the fourth thickness T4 may be less than the third thickness T3. It should be noted that under a cross-section, the third thickness T3 may be defined by the maximum thickness of the third portion 182 of the second insulation layer 180 in the normal direction Y of the substrate 110, and the fourth thickness T4 may be defined by the minimum thickness of the fourth portion 183 of the second insulation layer 180 in the normal direction Y of substrate 110. The third thickness T3 and the fourth thickness T4 can be obtained by measuring an SEM image of a local area. The SEM image may show the edge of the active layer 142, at least a portion of the third portion 182 of the second insulation layer 180, and at least a portion of the fourth portion 183 of the second insulation layer 180, but not limited thereto.

Please refer to FIG. 5. In some embodiments, the second insulation layer 180 is similar to the first insulation layer 130 and may be configured as the protective layer of the semiconductor layer SE. In some embodiments, the material of the second insulation layer 180 may be different or the same as the first insulation layer 130. In some embodiments, during or after the active layer 142 of the detection element 140 is etched, the second insulation layer 180 may be etched to reduce the thickness of a portion of the second insulation layer 180 (such as the second insulation layer 180 not covered by the active layer 142 of the detection element 140) to form another recess 181 of the second insulation layer 180. By reducing the thickness of the portion of the second insulation layer 180, the portion of the second insulation layer 180 that may have more gas (such as including hydrogen ions, oxygen ions, or other ions or elements) may be removed, which helps to reduce the issue of the characteristics of the active elements changing due to the influence of the gas.

Figure 6:
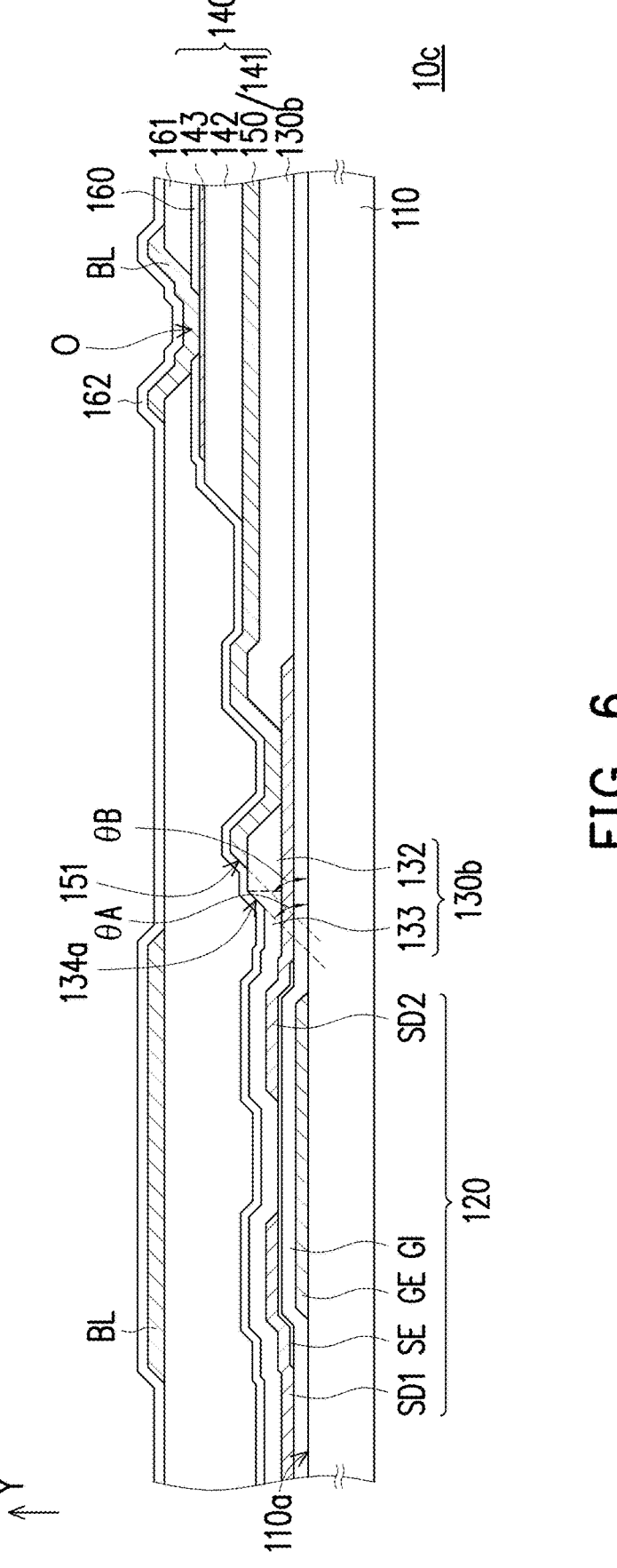
FIG. 6 is a schematic cross-sectional view of an electronic device according to yet another embodiment of the disclosure.

FIG. 6 is a schematic cross-sectional view of an electronic device according to yet another embodiment of the disclosure. An electronic device 10c of the embodiment is substantially similar to the electronic device 10 of FIG. 2, and the similar components in the two embodiments will not be repeated. The electronic device 10c differs from the electronic device 10 in that in the electronic device 10c, at least a portion of a first side wall surface 134a of a first insulation layer 130b is not aligned with at least a portion of the second side wall surface 151 of the conductive layer 150. In other words, under a cross-section, the first insulation layer 130b and the conductive layer 150 form a stepped structure therebetween, but not limited thereto. In some embodiments, as shown in FIG. 6, the included angle θA between the extension surface of the first side wall surface 134a and the top surface 110a of the substrate 110 may be substantially equal to the included angle θB between the extension surface of the second side wall surface 151 and the top surface 110a of the substrate 110, but not limited thereto. In some embodiments (not shown), the included angle θA between the extension surface of the first side wall surface 134a and the top surface 110a of the substrate 110 may be different from the included angle θB between the extension surface of the second side wall surface 151 and the top surface 110a of the substrate 110.

FIG. 7 is a flowchart of a manufacturing method of an electronic device according to an embodiment of the disclosure. Please refer to FIG. 2 and FIG. 7 at the same time. First, Step S210 is performed. Forming the active element 120 on the substrate 110. The active element 120 includes the gate GE, the gate insulation layer GI, the semiconductor layer SE, the source SD1, and the drain SD2. Next, Step S220 is performed. Forming the first insulation layer 130 on the active element 120. Next, Step S230 is performed. Forming the conductive layer 150 on the first insulation layer 130. Then, performing an etching process on a region of the first insulation layer 130 which is not overlapping with the conductive layer 150 to form the recess 131. By forming the recess 131 of the first insulation layer 130, the thickness of the first insulation layer 130 not overlapping with the conductive layer 150 (such as the second portion 133) is reduced. Next, Step S240 is performed. Forming an active layer 142 of the detection element 140 on the conductive layer 150. Finally, Step S250 is performed. The electronic device 10 having the detection element 140 is completed.

In addition, please refer to FIG. 5 and FIG. 7 at the same time. After Step S230, Step S260 is selectively performed. Forming a second insulation layer 180 on the conductive layer 140 before forming the active layer 142. Next, Step S270 is performed. Forming the active layer 142 of the detection element 140 on the second insulation layer 180. Then, performing another etching process on a region of the second insulation layer 180 not overlapping with the active layer 142 to form another recess 181. Finally, Step S280 is performed. The electronic device 10b having the detection element 140 is completed.

FIG. 8 is a flowchart of a manufacturing method of an electronic device according to another embodiment of the disclosure. Please refer to FIG. 4 and FIG. 7 at the same time. First, Step S310 is performed. Forming an active element 120 on the substrate 110. Next, Step S320 is selectively performed. Forming an insulation layer (not shown) on the active element 120. Then, Step S330 is performed. Forming a flat layer 170 on the active element

120. Then, Step S340 is performed. Forming a first insulation layer 130a on the active element 120. Next, Step S350 is performed. Forming a conductive layer 152 on the first insulation layer 130a. Then performing an etching process on a region of the first insulation layer 130a which is not overlapping with the conductive layer 152 to form the recess 131a. Next, Step S360 is performed. Forming the active layer 142a of the detection element 140a on the conductive layer 152, the conductive layer 152 is a lower electrode of the detection element 140a. Finally, Step S370 is performed. The electronic device 10a having the detection element 140a is completed.

Figure 9:
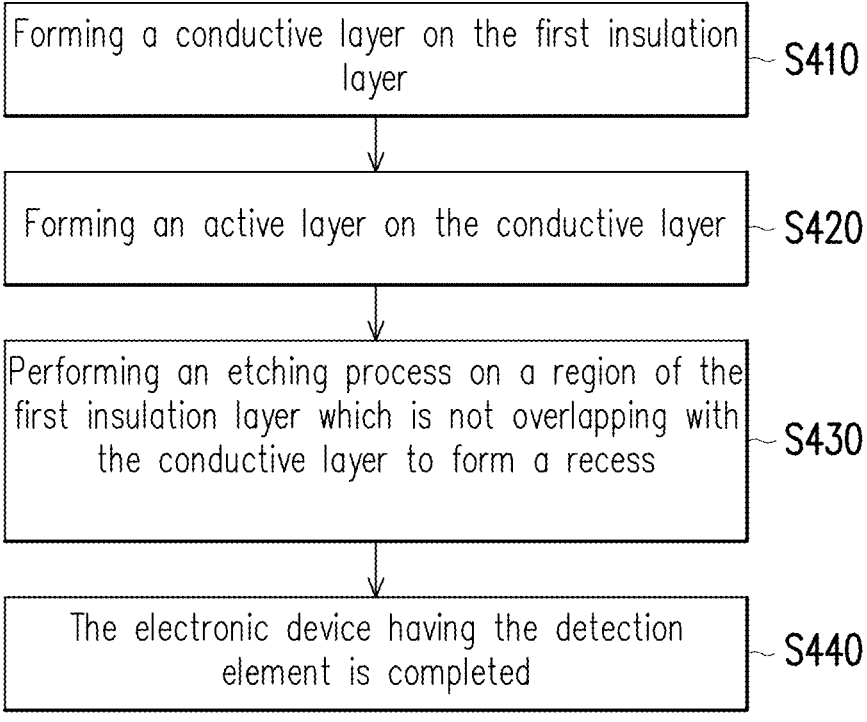
FIG. 9 is a flowchart of a manufacturing method of an electronic device according to yet another embodiment of the disclosure.

FIG. 9 is a flowchart of a manufacturing method of an electronic device according to yet another embodiment of the disclosure. The manufacturing method of the electronic device of the embodiment is substantially similar to the manufacturing method of the electronic device of FIG. 8, so the similar manufacturing methods in the two embodiments will not be repeated here. The manufacturing method of the electronic device of FIG. 9 differs from the manufacturing method of the electronic device of FIG. 8 mainly in that in the manufacturing method of the electronic device of FIG. 9, for example, an etching process is performed on the first insulation not overlapping with the conductive layer after the active layer of the detection element is disposed, but not limited thereto.

In detail, in the manufacturing method of the electronic device of FIG. 9, according to FIG. 8 first, for example, Steps S310 to S340 are performed. Step S320 and/or Step S330 may be deleted according to requirements. Next, please refer to FIG. 9 to perform Step S410. Forming a conductive layer 150 on the first insulation layer 130. Next, Step S420 is performed. Forming an active layer 142 of the detection element 140 on the conductive layer 150. Next, Step S430 is performed. Performing an etching process on a region of the first insulation layer 130 which is not overlapping with the conductive layer 150 to form a recess 131. Finally, Step S440 is performed. The electronic device having the detection element 140 is completed. In addition, in some embodiments, Step S420 and Step S430 may be performed at the same time, that is, when the active layer 142 of the detection element 140 is disposed or formed on the conductive layer 150, the etching process may be simultaneously performed on a region of the first insulation layer 130 which is not overlapping with the conductive layer 150 to form the recess 131 of the first insulation layer 130.

In summary, the insulation layer of the electronic device according to the embodiments of the disclosure is disposed or formed on the active element, which can reduce the influence of liquid and/or gas (such as including hydrogen ions, oxygen ions, or other ions or elements) on the active element during the manufacturing process. In addition, by removing a portion of the insulation layer adjacent to or corresponding to the active element to form the recess, the chance that the gas in the insulation layer diffuses to the active element may reduce, and/or the chance of the characteristics of the active element being changed is reduced. With such design, the electronic device according to the embodiments of the disclosure can have better reliability.

Finally, it should be noted that the above embodiments are only used to illustrate the technical solutions of the disclosure, rather than limiting them. Although the disclosure has been described in detail with reference to the foregoing embodiments, persons of ordinary skill in the art should understand that they can still modify the technical solutions described in the foregoing embodiments, or equivalently replace some or all of the technical features therein. How-ever, the modifications or replacements do not deviate the essence of the corresponding technical solutions from the scope of the technical solutions of the embodiments of the disclosure.

What is claimed is:

1. An electronic device, comprising:
a substrate;
an active element, disposed on the substrate;
a first insulation layer, disposed on the active element;
a detection element, disposed on the first insulation layer, wherein the detection element comprises a lower electrode disposed on the first insulation layer, an active layer disposed on the lower electrode and an upper electrode disposed on the active layer, the lower electrode is a part of a conductive layer, wherein the active layer is disposed between the lower electrode and the upper electrode,
wherein the first insulation layer has a recess, and the recess does not overlap with the conductive layer in a normal direction of the substrate,
wherein in the normal direction of the substrate, a first portion of the first insulation layer overlaps with the conductive layer and has a first thickness, a second portion of the first insulation layer does not overlap with the conductive layer and has a second thickness, and the second thickness is less than the first thickness,
wherein in the normal direction of the substrate, the recess overlaps with at least a portion of a channel area of the active element and the second portion, and the recess does not overlap with the detection element and the first portion; and
a second insulation layer, disposed between the active layer and the lower electrode, wherein the second insulation layer has another recess, and in the normal direction of the substrate, the another recess does not overlap with the active layer.

2. The electronic device according to claim 1, wherein the recess has a depth, and the depth is greater than or equal to 0.01 μm and less than or equal to the first thickness.

3. The electronic device according to claim 1, wherein a depth of the recess is a maximum distance between a top surface of the first portion and a top surface of the second portion in the normal direction of the substrate.

4. The electronic device according to claim 1, wherein an angle between a first side wall surface of the recess and a top surface of the first portion is greater than 90 degrees.

5. The electronic device according to claim 1, further comprising:
a flat layer, disposed between the active element and the first insulation layer.

6. The electronic device according to claim 1, wherein at least a portion of a first side wall surface of the recess is aligned with at least a portion of a second side wall surface of the conductive layer.

7. The electronic device according to claim 6, wherein an included angle between an extension surface of the first side wall surface and a top surface of the substrate is equal to an included angle between an extension surface of the second side wall surface and the top surface of the substrate.

8. The electronic device according to claim 1, wherein at least a portion of a first side wall surface of the recess is not aligned with at least a portion of a second side wall surface of the conductive layer.

9. The electronic device according to claim 1, wherein in the normal direction of the substrate, a third portion of the second insulation layer overlaps with the active layer and has a third thickness, a fourth portion of the second insulation layer does not overlap with the active layer and has a fourth thickness, and the fourth thickness is less than the third thickness.

10. The electronic device according to claim 1, wherein the second insulation layer has an opening, and the active layer is electrically connected to the lower electrode via the opening.

11. The electronic device according to claim 1, wherein in the normal direction of the substrate, the another recess overlaps with a portion of the lower electrode.

\* \* \* \* \*